(12) United States Patent
Cheng et al.

(10) Patent No.: US 7,094,697 B2
(45) Date of Patent: Aug. 22, 2006

(54) METHOD FOR PREPARING A DEEP TRENCH AND AN ETCHING MIXTURE FOR THE SAME

(75) Inventors: Meng Fen Cheng, Taichung (TW); Ya Ling Po, Hsinchu (TW); Ting Sing Wang, Hsinchu (TW)

(73) Assignee: Promos Technologies, Inc., (TW)

( * ) Notice: Subject to any disclaimer, the term of this patent is extended or adjusted under 35 U.S.C. 154(b) by 121 days.

(21) Appl. No.: 10/979,161

(22) Filed: Nov. 3, 2004

(65) Prior Publication Data

US 2006/0057848 A1 Mar. 16, 2006

(30) Foreign Application Priority Data

Sep. 16, 2004 (TW) .............................. 93128117 A

(51) Int. Cl.
*H01L 21/311* (2006.01)
*H01L 21/8242* (2006.01)
*H01L 21/20* (2006.01)

(52) U.S. Cl. .................. 438/700; 438/243; 438/386
(58) Field of Classification Search .................. None
See application file for complete search history.

(56) References Cited

U.S. PATENT DOCUMENTS

2003/0143855 A1* 7/2003 Chen et al. ................. 438/700
2003/0153158 A1* 8/2003 Ho et al. .................... 438/386

* cited by examiner

*Primary Examiner*—Ha Nguyen
*Assistant Examiner*—Cheung Lee
(74) *Attorney, Agent, or Firm*—Oliff & Berridge, PLC

(57) ABSTRACT

The method for preparing a deep trench uses a dry etching process to form a trench in a silicon substrate, and an etching mixture is then coated on the surface of the silicon substrate and inside the deep trench. A portion of etching mixture is removed from the surface of the silicon substrate and the trench above a predetermined depth from the surface of the substrate, and an etching process is then performed using the etching mixture remaining inside the trench to etch the silicon substrate below the predetermined depth so as to form the deep trench. The etching mixture comprises a conveying solution and an etchant, and the viscosity of the conveying solution is higher than that of the etchant. The conveying solution is spin-on-glass or a photoresist, and the etchant is tetramethylammonium hydroxide, ammonium, or hydrofluoric acid. The volume ratio of the conveying solution and the etchant is preferably between 50:1 and 20:1.

18 Claims, 5 Drawing Sheets

METHOD FOR PREPARING A DEEP TRENCH AND AN ETCHING MIXTURE FOR THE SAME

BACKGROUND OF THE INVENTION (A) Field of the Invention

The present invention relates to a method for preparing a deep trench and an etching mixture for the same, and more particularly, to a method for preparing a deep trench of a DRAM cell and an etching mixture for the same.

(B) Description of the Related Art

A memory cell of the DRAM consists of a metal oxide field-effect transistor and a capacitor on the silicon substrate, and the source of the transistor is electrically connected to the upper storage plate of the capacitor. There are two types of capacitors: stack and deep trench. The stack capacitor is fabricated directly on the surface of the silicon substrate, while the deep trench capacitor is fabricated inside the silicon substrate. Recently, the integrity of the DRAM has increased with the innovation of semiconductor process technology rapidly. However, the size of the memory cell must be shrunk to achieve the purpose of high integrity, i.e., increasing the integrity needs to reduce the size of the transistor and the capacitor.

FIG. 1 is a cross-sectional diagram of a deep trench 10 according to the prior art. As shown in FIG. 1, the method for preparing the deep trench 10 first forms a hard mask layer 14 and a photoresist layer 16 on a silicon substrate 12, and a photolithography process is then performed to form two openings 18 in the photoresist layer 16. An anisotropic etching process, such as the reactive ion etching process or the plasma etching process, is performed to remove a portion of the hard mask layer 14 and silicon substrate 12 under the two openings 18 to form two deep trenches 10 in the silicon substrate 12. As the diameter of the deep trench 10 shrinks, the deep trench 10 deviates from being the same diameter, but tends to have a larger diameter at the upper portion and a smaller diameter at the bottom portion.

The capacitance is proportional to the surface area of the electrode, and the surface area of the electrode for the deep trench capacitor is a product of the depth and the circumference of the deep trench, wherein the circum area depends on the diameter of deep trench. With the continuous reduction of the DRAM cell, the diameter of the deep trench is reduced accordingly, and the deep trench 10 cannot provide a sufficient surface area according to the prior art. In addition, with the continuous reduction of the DRAM cell, the width of a local silicon substrate 20 separating the two deep trenches 10 becomes smaller. Consequently, the local silicon substrate 20 may be removed during the subsequent etching process to result in the direct connecting of the two deep trenches 10, which invalidate the subsequent formed capacitor due to electrical connecting.

SUMMARY OF THE INVENTION

The objective of the present invention is to provide a method for preparing a deep trench and an etching mixture for the same.

In order to achieve the above-mentioned objective and avoid the problems of the prior art, the present invention provides an method for preparing a deep trench in a silicon substrate. The present method first uses a dry etching process to form a trench in the silicon substrate, and an etching mixture is then coated on the surface of the silicon substrate and inside the deep trench. A portion of etching mixture is removed from the surface of the silicon substrate and the trench above a predetermined depth from the surface of the substrate, and an etching process is then performed using the etching mixture remaining inside the trench to etch the silicon substrate below the predetermined depth so as to form the deep trench. Deionized water is used to clean the substrate in order to remove the etching mixture in the deep trench. The etching mixture comprises a conveying solution and an etchant, and the viscosity of the conveying solution is higher than that of the etchant. The conveying solution is spin-on-glass or a photoresist, the etchant is tetramethylammonium hydroxide, and the volume ratio of the conveying solution and the etchant is preferably between 50:1 and 25:1. In addition, the etchant can be ammonia or hydrofluoric acid, and the volume ratio of the conveying solution and the etchant is preferably between 50:1 and 20:1.

Compared with the prior art, the present method for preparing a deep trench can enlarge the diameter of the deep trench to increase the surface area, and the subsequently formed capacitor in the deep trench can possess a higher capacitance. Consequently, the present invention can be applied to the fabrication of the capacitor used in the DRAM cell with high integrity. In addition, the present method uses the etching mixture remaining inside the bottom portion of the trench to locally etch the silicon substrate below the predetermined depth without etching the silicon substrate at the upper portion separating the trenches, so that the upper portions of the formed deep trenches will not be connected to each other.

BRIEF DESCRIPTION OF THE DRAWINGS

Other objectives and advantages of the present invention will become apparent upon reading the following description and upon reference to the accompanying drawings in which.

DETAILED DESCRIPTION OF THE INVENTION

Figure 1:
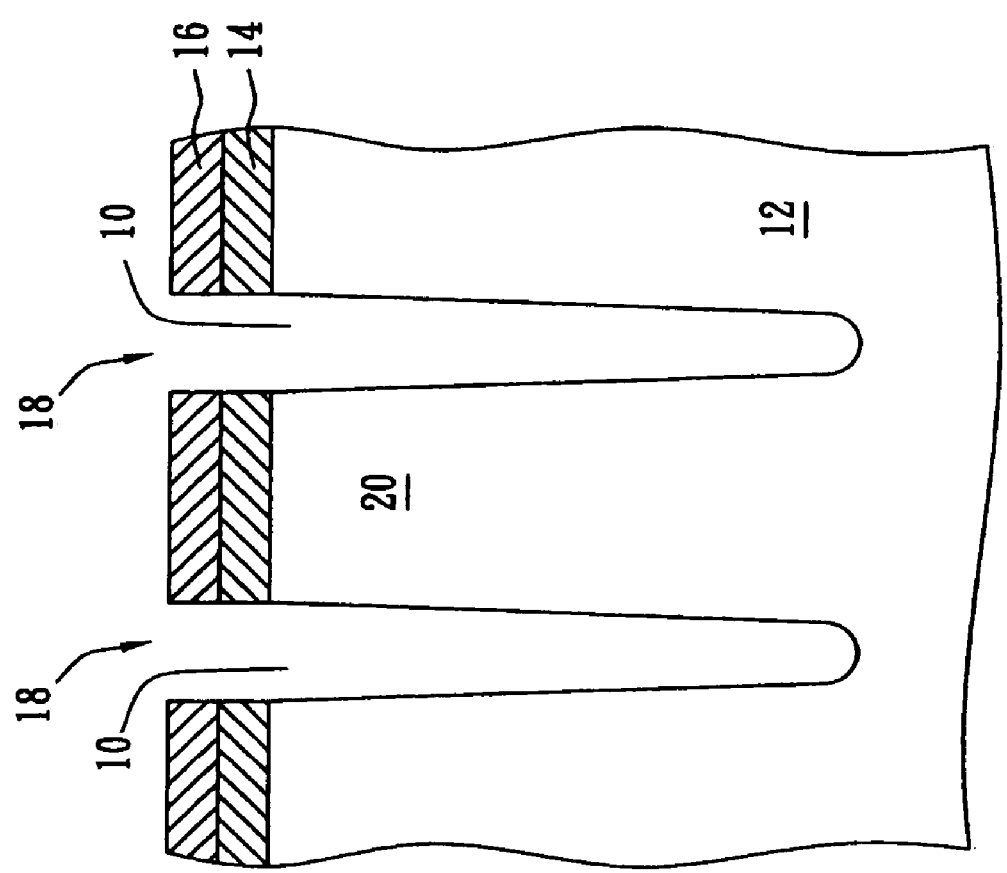
FIG. 1 is a cross-sectional diagram of a deep trench according to the prior art.
Figure 2:
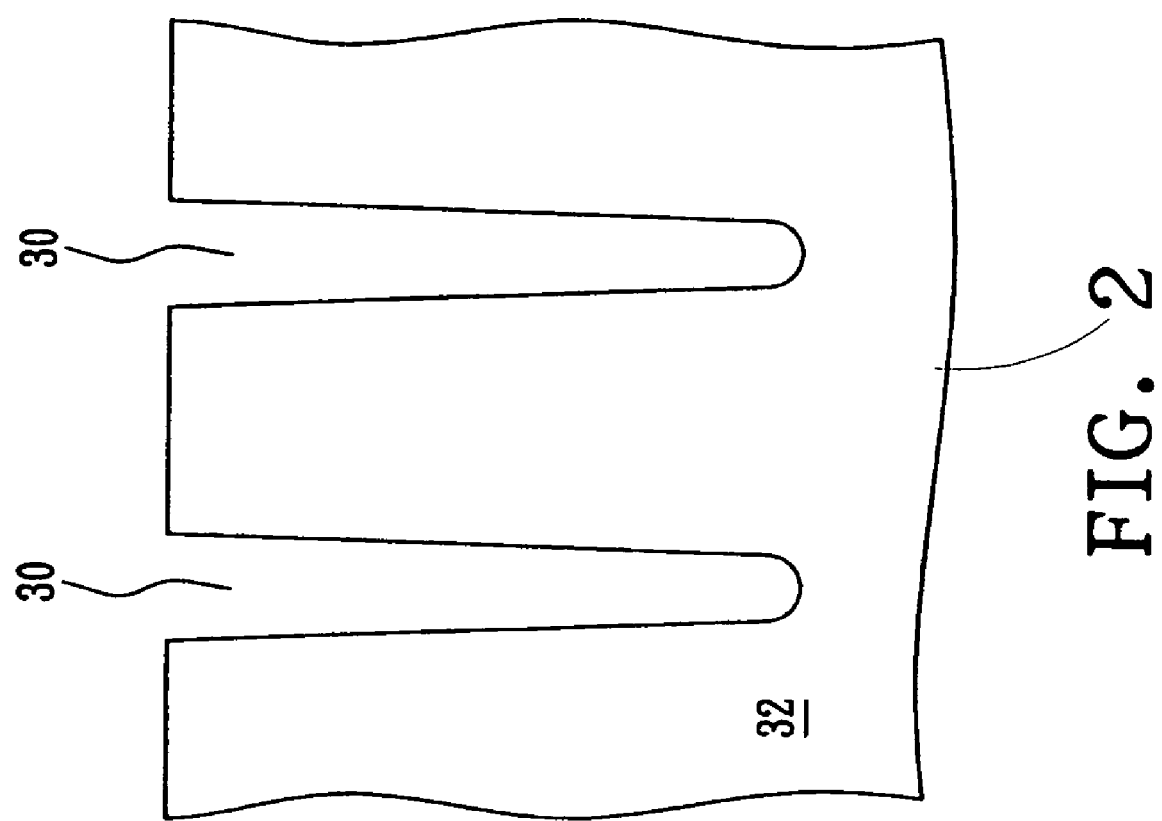
FIG. 2 to FIG. 5 show the method for preparing a deep trench 40 in a silicon substrate 32 according to the present invention.
Figure 3:
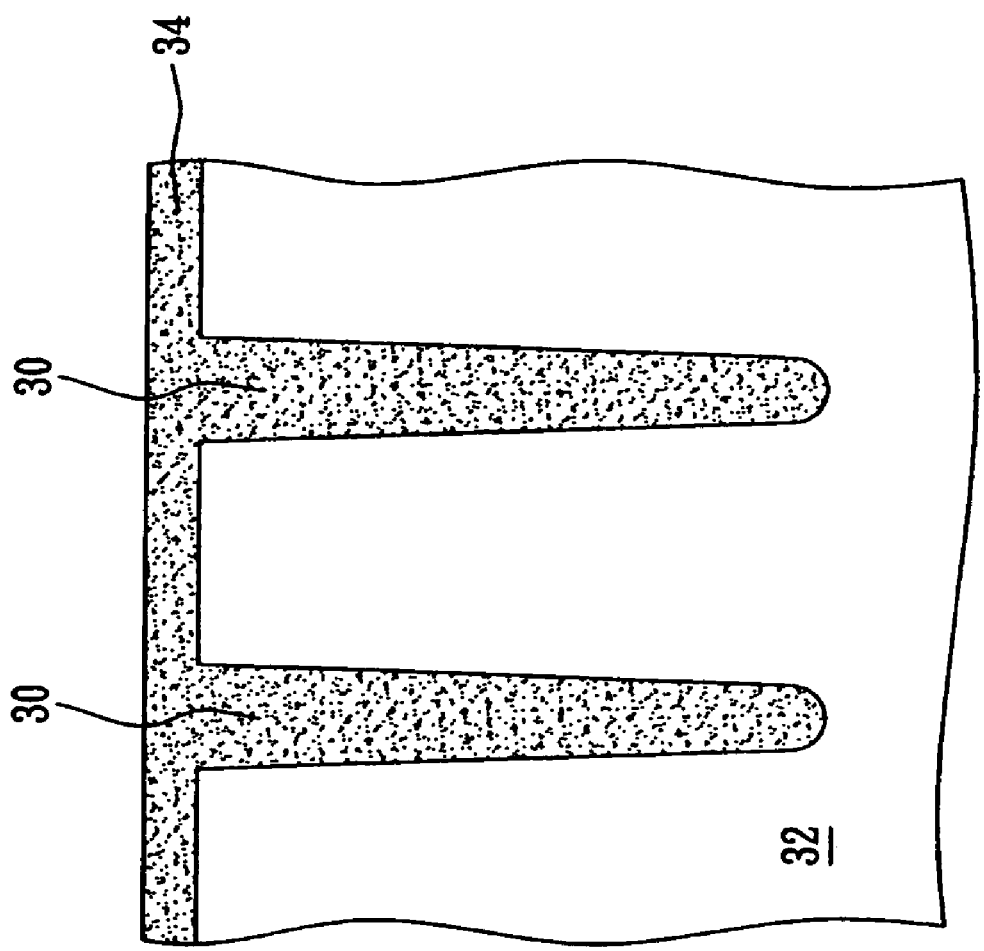

FIG. 2 to FIG. 5 show the method for preparing a deep trench 40 in a silicon substrate 32 according to the present invention. As shown in FIG. 2, the present invention first forms two trenches 30 in the silicon substrate 32 using a dry etching process. As the diameter of the trench 30 shrinks, the trench 10 deviates from being the same diameter vertically, but tends to have a larger diameter at the upper portion and a smaller diameter at the bottom portion. An etching mixture 34 is then coated on the surface of the silicon substrate 32 and inside the trench 30, as shown in FIG. 3.

The etching mixture 34 comprises a conveying solution and an etchant, and the viscosity of the conveying solution is higher than that of the etchant. The conveying solution can be spin-on glass (SOG) or photoresist, the etchant can be tetramethylammonium hydroxide (TMAH), and the volume ratio of the conveying solution to the etchant is between 50:1 and 25:1. In addition, the etchant can be ammonia (NH$_4$OH) or hydrofluoric acid (HF), and the volume ratio of the conveying solution to the etchant is between 50:1 and 20:1.

Since the diameter of the trench 30 is very small (about 200 nm), the viscosity of the etchant such as TMAH, ammonia and hydrofluoric acid, is relative low (larger surface tension) and cannot easily flow into the trench 30. On the contrary, the etching mixture 34 consisting of the etchant and the conveying solution with a higher viscosity can flow into the trench 30. In other words, the conveying solution is used to deliver the etchant into the trench 30.

Figure 4:
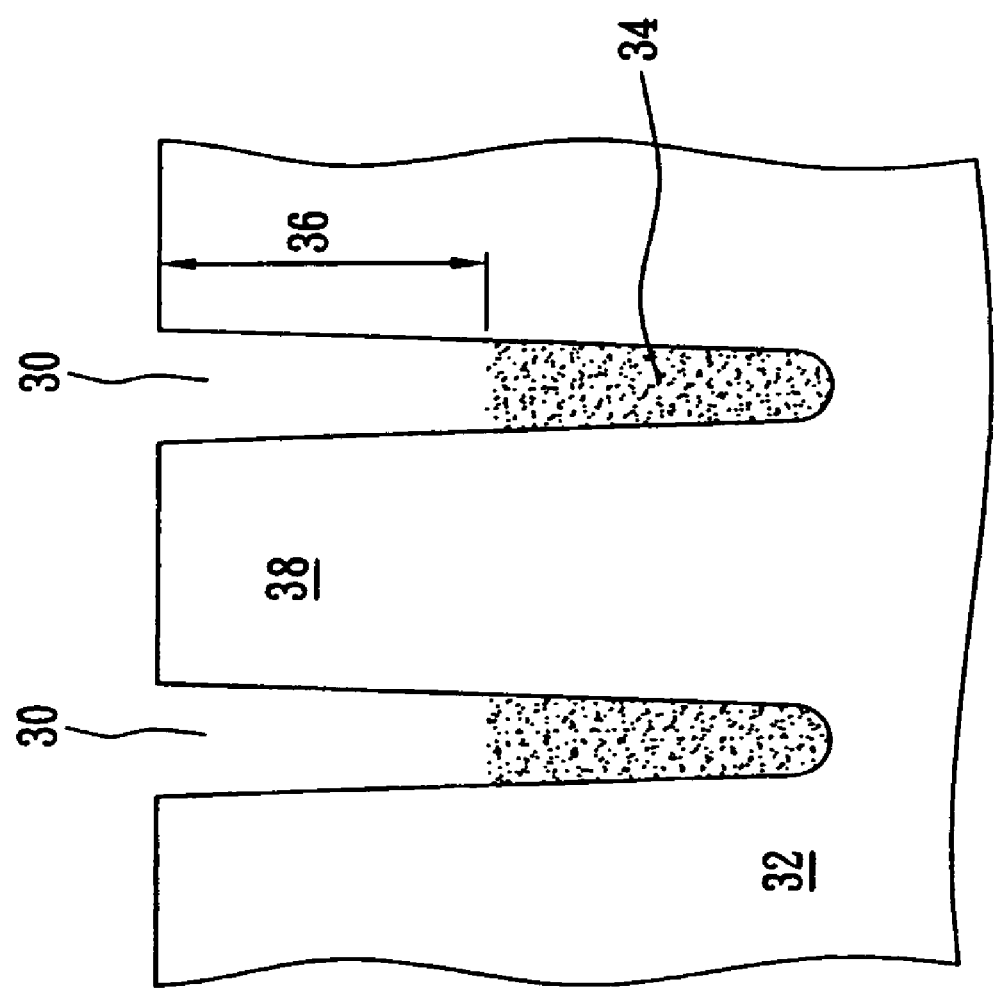

Please refer to FIG. 4, which shows that a portion of the etching mixture 34 is removed from the surface of the silicon substrate 32 and the trench 30 above a predetermined depth 36, while keeping the etching mixture 34 inside the trench 30 below the predetermined depth 36. The etching mixture 34 above the predetermined depth 36 can be removed using a dry etching process or wet etching process. In addition, if the conveying solution is photoresist, a photolithography process can remove the etching mixture 34 above the predetermined depth 36. For example, an exposure process is performed to illuminate the etching mixture 34 to be removed to initiate a photochemical reaction therein, which will transform the photoresist into a structure soluble in a development solution. A development process is then performed using a development solution to remove the etching mixture 34 above the predetermined depth 36.

Figure 5:
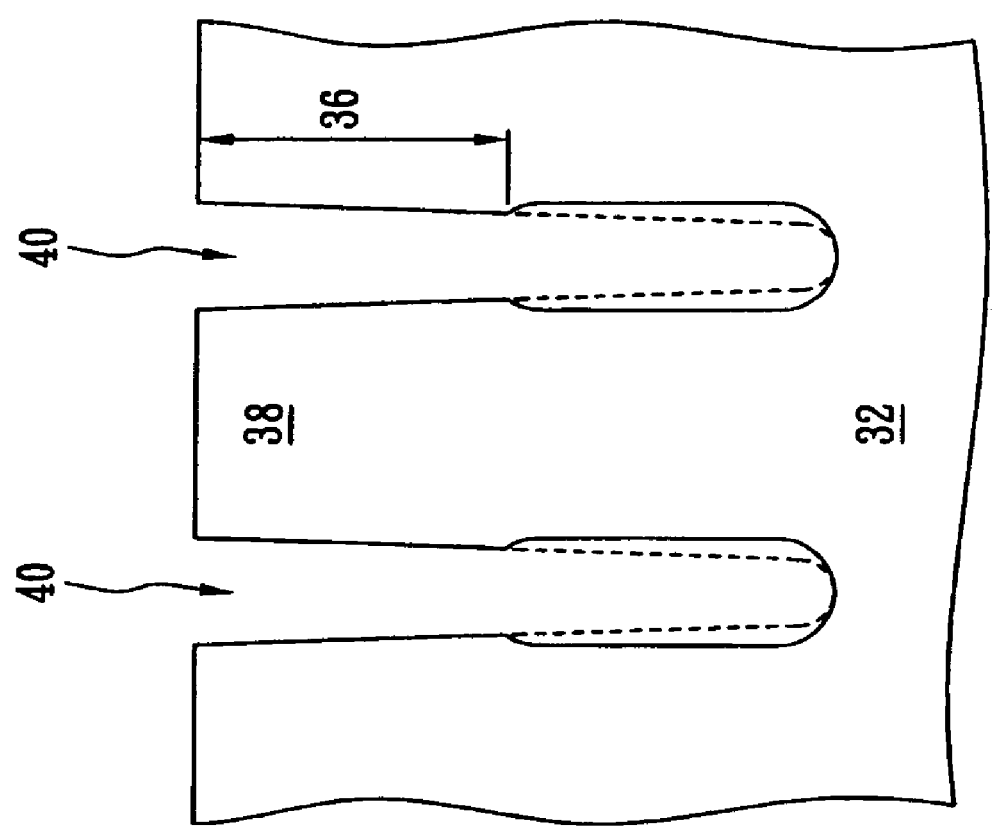

Please refer to FIG. 5, which shows that the etching mixture remaining inside the trench 30 is used to perform an etching process to etch the silicon substrate 32 below the predetermined depth 36 to form a deep trench 40. A deionized water is then used to clean the silicon substrate 32 to remove the etching mixture 34 in the deep trench 40. In addition, the silicon substrate 32 can be heated to about 50° C. to increase the etching reaction rate during the etching process if the etchant of the etching mixture 34 is ammonia or hydrofluoric acid.

Compared with the prior art, the present method for preparing a deep trench 40 can enlarge the diameter of the deep trench 40 to increase the surface area, and the subsequent formed capacitor in the deep trench 40 can possess a higher capacitance. Consequently, the present invention can be applied to the fabrication of the capacitor used in the DRAM cell with high integrity.

In addition, the present method uses the etching mixture 34 remaining inside the bottom portion of the trench 30 to locally etch the silicon substrate 32 below the predetermined depth 36 without etching the silicon substrate 32 at the upper portion separating the trenches 30, i.e., the profile of the deep trenches 40 above the predetermined depth will not change due to the etching process using the etching mixture 34. As a result, the upper portions of the deep trenches 40 will not be connected to each other due to over-etching, and the subsequently formed capacitor in the deep trench 40 will not fail owing to the electrical connection.

The above-described embodiments of the present invention are intended to be illustrative only. Numerous alternative embodiments may be devised by those skilled in the art without departing from the scope of the following claims.

What is claimed is:

1. A method for preparing a deep trench, comprising steps of:
   forming a trench in a substrate;
   coating an etching mixture on the surface of the substrate and in the trench;
   removing a portion of the etching mixture above a predetermined depth of the trench;
   performing an etching process using the etching mixture in the trench to etch the substrate below the predetermined depth to form a deep trench; and
   removing the etching mixture in the deep trench.

2. The method for preparing a deep trench of claim 1, wherein the etching mixture comprises a conveying solution and an etchant, and the viscosity of the conveying solution is higher than the viscosity of the etchant.

3. The method for preparing a deep trench of claim 2, wherein the conveying solution is photoresist or spin-on glass.

4. The method for preparing a deep trench of claim 2, wherein the etchant is tetramethylammonium hydroxide, and the volume ratio of the conveying solution to the etchant is between 50:1 and 25:1.

5. The method for preparing a deep trench of claim 2, wherein the etchant is ammonia or hydrofluoric acid.

6. The method for preparing a deep trench of claim 5, wherein the volume ratio of the conveying solution to the etchant is between 50:1 and 20:1.

7. The method for preparing a deep trench of claim 5, further comprising a step of heating the substrate substantially to 50° C.

8. The method for preparing a deep trench of claim 1, wherein the step of removing a portion of the etching mixture above a predetermined depth of the trench uses a dry etching process.

9. The method for preparing a deep trench of claim 1, wherein the step of removing a portion of the etching mixture above a predetermined depth of the trench uses a wet etching process.

10. The method for preparing a deep trench of claim 1, wherein the step of removing a portion of the etching mixture above a predetermined depth of the trench comprises:
    performing an exposure process; and
    performing a development process to remove the etching mixture.

11. The method for preparing a deep trench of claim 1, wherein the step of removing the etching mixture in the deep trench uses a dry etching process.

12. The method for preparing a deep trench of claim 1, wherein the step of removing the etching mixture in the deep trench uses a wet etching process.

13. The method for preparing a deep trench of claim 1, further comprising a step of cleaning the deep trench by a deionized water.

14. An etching mixture comprising a conveying solution and an etchant capable of etching silicon, wherein the viscosity of the conveying solution is higher than the viscosity of the etchant.

15. The etching mixture of claim 14, wherein the conveying solution is photoresist or spin-on glass.

16. The etching mixture of claim 14, wherein the etchant is tetramethylammonium hydroxide, and the volume ratio of the conveying solution to the etchant is between 50:1 and 25:1.

17. The etching mixture of claim 14, wherein the volume ratio of the conveying solution to the etchant is between 50:1 and 20:1.

18. The etching mixture of claim 17, wherein the etchant is ammonia or hydrofluoric acid.

* * * * *